United States Patent
Biber et al.

(10) Patent No.: US 8,587,293 B2
(45) Date of Patent: Nov. 19, 2013

(54) COIL POSITION DETECTION

(75) Inventors: Stephan Biber, Erlangen/Frauenaurach (DE); Thorsten Feiweier, Poxdorf (DE); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 825 days.

(21) Appl. No.: 12/684,158

(22) Filed: Jan. 8, 2010

(65) Prior Publication Data

US 2010/0176800 A1 Jul. 15, 2010

(30) Foreign Application Priority Data

Jan. 13, 2009 (DE) .......................... 10 2009 004 448

(51) Int. Cl.
*G01B 7/14* (2006.01)
*G01B 7/30* (2006.01)
*G01R 33/02* (2006.01)

(52) U.S. Cl.
USPC ............ 324/207.13; 324/207.15; 324/207.16; 324/207.17; 324/309; 324/318; 324/200; 600/422; 600/407; 600/410

(58) Field of Classification Search
USPC ............... 324/207.15–207.17, 309, 318, 200; 600/422, 407, 410
See application file for complete search history.

(56) References Cited

U.S. PATENT DOCUMENTS

| | | | | |
|---|---|---|---|---|
| 3,304,492 A | * | 2/1967 | Glarum | 324/316 |
| 3,495,160 A | * | 2/1970 | Salvi et al. | 324/301 |
| 4,339,953 A | * | 7/1982 | Iwasaki | 73/654 |
| 4,739,267 A | * | 4/1988 | Leroux et al. | 324/314 |
| 5,001,428 A | * | 3/1991 | Maier et al. | 324/309 |
| 5,079,504 A | * | 1/1992 | Machida | 324/309 |
| 6,223,065 B1 | * | 4/2001 | Misic et al. | 600/410 |
| 6,396,272 B1 | * | 5/2002 | Dietz et al. | 324/318 |
| 6,900,636 B2 | | 5/2005 | Leussler | |
| 7,002,347 B2 | * | 2/2006 | Feiweier et al. | 324/318 |
| 7,006,676 B1 | * | 2/2006 | Zeylikovich et al. | 382/131 |
| 7,075,299 B1 | * | 7/2006 | Peters | 324/309 |
| 7,141,976 B2 | * | 11/2006 | Campagna | 324/318 |
| 7,266,406 B2 | * | 9/2007 | Kroeckel | 600/410 |
| 7,382,127 B2 | * | 6/2008 | Gaddipati et al. | 324/309 |
| 7,486,077 B2 | * | 2/2009 | Hergt et al. | 324/318 |
| 8,258,787 B2 | * | 9/2012 | Fischer et al. | 324/318 |
| 2002/0042567 A1 | * | 4/2002 | Heid | 600/410 |
| 2002/0169374 A1 | * | 11/2002 | Jevtic | 600/422 |
| 2002/0198448 A1 | * | 12/2002 | Zuk et al. | 600/414 |
| 2003/0231018 A1 | * | 12/2003 | Willig-Onwuachi et al. | 324/318 |

(Continued)

FOREIGN PATENT DOCUMENTS

| | | | | |
|---|---|---|---|---|
| JP | 2010162332 | * | 7/2010 | |
| JP | 20101623332 A | * | 7/2010 | |

OTHER PUBLICATIONS

Soliman et al., "Continuous and Discrete Signals and Systems", Prentice Hall, 1990, pp. 1-6.*

*Primary Examiner* — Arleen M Vazquez
*Assistant Examiner* — Lamarr Brown
(74) *Attorney, Agent, or Firm* — Schiff Hardin LLP

(57) ABSTRACT

A simple position determination is enabled by a device and a method to determine the position of a local coil in a magnetic resonance apparatus, wherein at least one signal emitted by at least one transmission coil is received by the local coil and is evaluated with a position determination device in order to determine the position of the local coil.

22 Claims, 3 Drawing Sheets

(56) References Cited

U.S. PATENT DOCUMENTS

| | | | |
|---|---|---|---|
| 2004/0032263 A1* | 2/2004 | Renz | 324/318 |
| 2004/0116797 A1* | 6/2004 | Takahashi et al. | 600/407 |
| 2005/0179433 A1* | 8/2005 | Wiesinger et al. | 324/309 |
| 2005/0264288 A1* | 12/2005 | Campagna et al. | 324/309 |
| 2005/0272998 A1* | 12/2005 | Diehl et al. | 600/410 |
| 2006/0108998 A1* | 5/2006 | Van Zundert et al. | 324/200 |
| 2006/0250133 A1* | 11/2006 | Krieg et al. | 324/318 |
| 2006/0273796 A1* | 12/2006 | Kuth et al. | 324/318 |
| 2007/0222445 A1* | 9/2007 | Hertz et al. | 324/307 |
| 2007/0229076 A1* | 10/2007 | Habara et al. | 324/318 |
| 2008/0033278 A1* | 2/2008 | Assif | 600/410 |
| 2008/0068016 A1* | 3/2008 | Gaddipati et al. | 324/318 |
| 2008/0088309 A1* | 4/2008 | Eberler et al. | 324/318 |
| 2008/0097189 A1* | 4/2008 | Dumoulin et al. | 600/410 |
| 2008/0211503 A1* | 9/2008 | Arnold et al. | 324/318 |
| 2008/0218168 A1* | 9/2008 | Takagi | 324/309 |
| 2008/0224701 A1* | 9/2008 | Okamoto | 324/318 |
| 2008/0272785 A1* | 11/2008 | Crozier et al. | 324/318 |
| 2008/0275333 A1* | 11/2008 | Fain et al. | 600/422 |
| 2009/0052760 A1* | 2/2009 | Smith et al. | 382/132 |
| 2009/0264735 A1* | 10/2009 | Steckner | 600/422 |
| 2009/0315556 A1* | 12/2009 | Driemel et al. | 324/307 |
| 2010/0052682 A1* | 3/2010 | Mueller | 324/318 |
| 2010/0072997 A1* | 3/2010 | Fischer et al. | 324/309 |
| 2010/0152568 A1* | 6/2010 | Kokubun | 600/410 |
| 2010/0156412 A1* | 6/2010 | Biber et al. | 324/307 |
| 2010/0182005 A1* | 7/2010 | Biber | 324/307 |
| 2010/0228117 A1* | 9/2010 | Hartmann | 600/424 |
| 2010/0256480 A1* | 10/2010 | Bottomley et al. | 600/411 |
| 2010/0271027 A1* | 10/2010 | Biber et al. | 324/318 |
| 2010/0292559 A1* | 11/2010 | Hannemann et al. | 600/407 |
| 2011/0092792 A1* | 4/2011 | Birman | 600/407 |
| 2011/0109315 A1* | 5/2011 | Biber et al. | 324/318 |

* cited by examiner

COIL POSITION DETECTION

BACKGROUND OF THE INVENTION

1. Field of the Invention

The present invention concerns methods and devices for the determination of the position of a local coil for a magnetic resonance apparatus.

2. Description of the Prior Art

Magnetic resonance apparatuses for examination of patients, in particular by means of magnetic resonance tomography are known from DE 10 342 15B4, for example.

Modern magnetic resonance systems normally operate with multiple different antennas (also called coils in the following) to emit radio-frequency pulses for nuclear magnetic resonance excitation and/or to receive the induced magnetic resonance signals. A magnetic resonance system typically has a larger coil that is normally permanently installed in the apparatus, known as a whole-body coil (also called a body coil or BC), as well multiple small local coils (also called surface coils or LCs). In contrast to the whole-body coil, the local coils serve to acquire detailed images of body parts or organs of a patient that are located relatively near to the body surface. For this purpose the local coils are applied directly at the point of the patient at which the region to be examined is located. Given a use of such a local coil, in many cases the transmission occurs with the whole-body coil (as transmission coil) permanently installed in the magnetic resonance system and the induced magnetic resonance signals are received with the local coil (as reception coil).

The position of local coils used to receive the MR signals in the medical MR imaging can vary relative to the patient table and to the patient. Optical detection with a camera and RFID methods has been considered as solution approaches to determine the position. An additional known method uses the MR imaging itself in order to localize the coils. Disadvantages of the optical detection and the RFID method are the necessary additional components in the coil and/or in the MR scanner that incur costs. Disadvantages of the MR imaging are the time cost (a separate measurement is required for every bed (patient) position) and the problematic reliability (dependency on MR imaging parameters, for example B0 homogeneity, B1 homogeneity, in particular at the edge of the imaging volume).

SUMMARY OF THE INVENTION

An object of the present invention is to enable an optimally efficient determination of the position of a local coil of a magnetic resonance apparatus.

According to the invention, a device to determine the position of a local coil for a magnetic resonance apparatus, has a local coil to receive a signal emitted by at least one transmission coil, and a position determination device to evaluate the signal and determine from this signal the position of the local coil.

According to the invention, a method is also provided to determine the position of a local coil for a magnetic resonance apparatus, wherein at least one signal emitted by at least one transmission coil is received by the local coil and evaluated with a position determination device in order to determine the position of the local coil.

An advantage of the invention is the utilization of components that are generally already present for the position determination, which can yield a cost advantage. Even if an additional pickup coil were to be used for the new method instead of an existing coil, this component is extremely cost-effective since the entire activation and signal generation system is already present in the scanner (it can be operated at the MR transmission frequency).

Possible interferences with or negative effects on the measurement workflow are avoided since no additional time is required for a coil position detection, as in known MR methods.

A simple determination of the position of these local coils entails advantages for the system operation. For example, given a known position of the local coils it is possible to assign a reasonable combination of reception coils with measurement protocols automatically (without interaction with the user). Coils that are far removed from the imaging volume do not improve the SNR of the image, but rather to the contrary increase the noise level or intensify image artifacts (ambiguity artifacts—"third arm") and therefore should not be activated. Furthermore, the known position of the local coils allows a measurement protocol to determine the possibilities (acceleration factors and directions) of the parallel imaging. This information can be used for an automatic determination of optimal acquisition parameters, for example, or be provided to the user in a suitable manner (limitation or suitable display of the reasonable range of protocol parameters).

In particular, a determination of the coil position is accomplished by measurement of the coupling of one or more (advantageously small) transmitting coils relative to at least one local coil upon driving the bed into the patient tunnel. A determination of the position of the local coil relative to the stationary transmitting coupling coil can ensue by evaluation of the signal, in particular by measurement of the amplitude and/or phase of the coupling of the two coils depending on the bed position (z-profile) and a maximum or zero crossing evaluation of the amplitude and/or phase.

In the event that, according to an embodiment of the invention, not just one but rather multiple coils are used as transmission coils, the precision of the measurement can be increased, or not only a z-position detection but also a detection of the azimuthal position can ensue.

According to an embodiment of the invention, the pickup coils of the body coil that are already present in many MR systems (which pickup coils serve to detect the body coil B1 fields in MR transmission operation) can be used for the transmitting coupling coils. The pickup coils have previously not been used during the insertion of the bed and could advantageously be connected alternately with a receiver device or with a signal source by crossover switches.

In addition to a co-planar arrangement of a transmitting coil relative to the local coil according to one embodiment of the invention, according to an additional embodiment of the invention an orthogonal arrangement of at least one transmitting coil relative to the local coil is also advantageous. It offers the advantage of a sharp zero crossing of the coupling amplitude as well as a detection of the structure of the local coil given advantageous geometric relationships.

In another embodiment of the invention, wherein a multichannel transmission array is present in the tomography device, its elements are used in place of the pickup coils.

If, according to another embodiment of the invention wherein multiple transmission coils are used for coil detection, the signals can be differentiated, for example via different transmission frequencies or via a multiplexing (temporally offset transmission with the individual coils).

DESCRIPTION OF THE PREFERRED EMBODIMENTS

Figure 1:
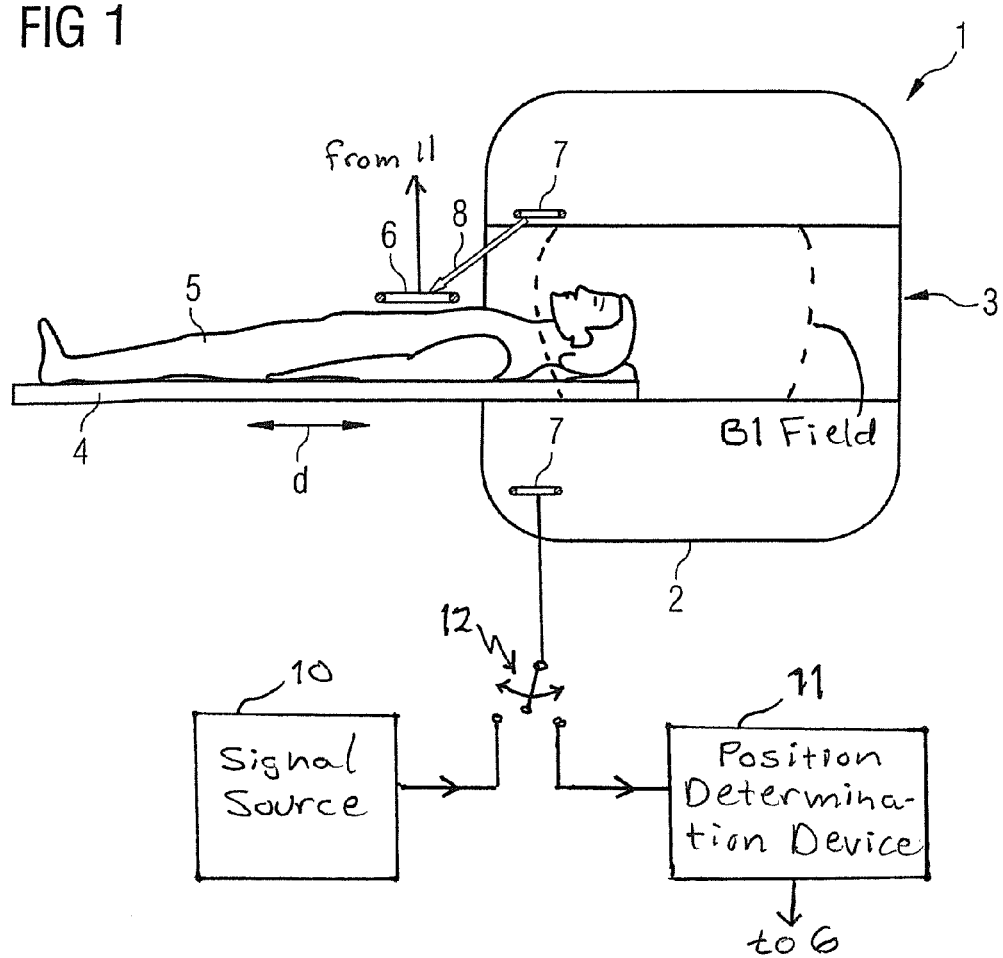
FIG. 1 schematically illustrates an MRT whole-body coil and a local coil whose position is to be determined.

FIG. 1 shows a magnetic resonance apparatus MRT 1 with a whole-body coil 2 with a tubular space 3 into which a patient bed 4 (with a patient 5 and a local coil 6, for example) can be driven in order to generate exposures of the patient 5. Here a local coil 6, with which good exposures are enabled in a local range, is placed on the patient 5.

The position of the local coil 6 should be determined. For this a signal 8 emitted by at least one transmission coil 7 is received and evaluated with a position determination device 11 connected with the local coil 6 and the transmission coil 7 (and possibly the whole-body coil 2) directly or via other elements by schematically represented connections. With the position determination device 11, the position (relative to the transmission coil and, therefore, possibly relative to the patient bed and/or the patient and/or to the MRT whole-body coil) of the local coil 6 can be determined.

For position determination, the amplitude and/or phase of signals sent by at least one transmission coil 7 and received in the local coil 6 is evaluated in the position determination device 11.

The signal emitted by a transmission coil can also be a signal emitted specifically to enable the position determination of a local coil and/or a signal that is used only for this purpose.

Figure 2:
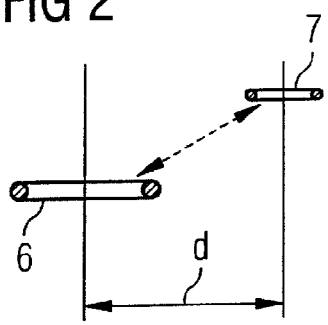
FIG. 2 shows a co-planar arrangement of a transmission coil and a local coil.
Figure 3:
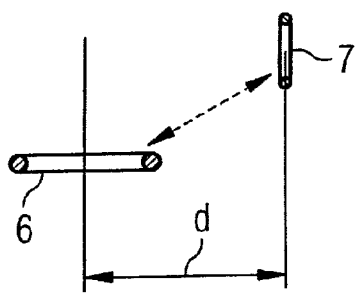
FIG. 3 shows an orthogonal arrangement of a transmission coil and a local coil.

The transmission coil or transmission coils and the local coil can be arranged coplanar to one another according to FIG. 2 (thus pointing in the same direction) or orthogonal to one another according to FIG. 3 (thus point in directions orthogonal to one another).

Figure 4:
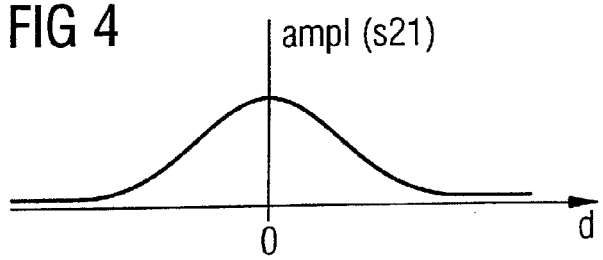
FIG. 4 shows an amplitude curve in the local coil in an arrangement according to FIG. 2.

In a co-planar arrangement according to FIG. 2, during a movement of the patient bed with the local coil 6 in the longitudinal direction (d) of the whole-body coil (thus into this), the amplitude curve according to FIG. 4 results during the movement, wherein the position of the local coil at d=0 (thus when the local coil 6 is located under the transmission coil) can be determined well with a maximum detection (which position can be used given a further movement of the patient bed by a specific distance), possibly under consideration of this to calculate a new position of the limit value. If the transmission coil 7 is located approximately at the left end of the whole-body coil 2 in FIG. 1, for example, in which patient bed position the local coil 6 is located there can thus be determined. This position of the local coil can be used in order to later associate from it signals received from the whole-body coil in the imaging operation (or ii determined from said signals) with a position of the bed or of the whole-body coil or in the patient.

Figure 5:
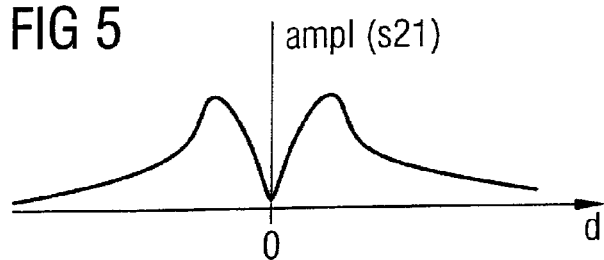
FIG. 5 shows an amplitude curve in the local coil in an arrangement according to FIG. 3.

Given an orthogonal arrangement of the coils 6, 7 relative to one another according to FIG. 3, during a movement of the patient bed with the coil in the longitudinal direction (d) of the whole-body coil (thus into this) the amplitude curve ampl (s21) according to FIG. 5 results during the movement, so the position of the local coil at d=0 (thus when the local coil 6 is located under the transmission coil) can be determined well with an amplitude minimum detection (which position can be used to calculate a new position given a further movement of the patient bed by a specific distance, possibly to intentionally reach this new position). If the transmission coil 7 is located at the left end of the whole-body coil 2 in FIG. 1, for example, the patient bed position, or where relative to the patient or to the whole-body coil etc. the local coil 6 is located, can be determined.

Figure 6:
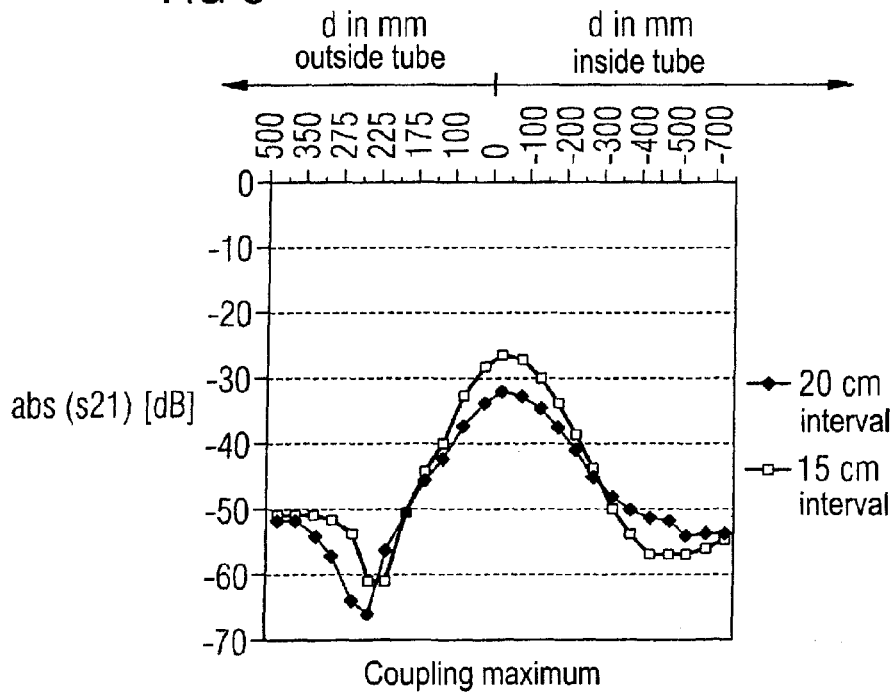
FIG. 6 shows amplitude curves in the local coil.

FIG. 6 shows an example the measured curve of the amplitude of the signal sent by a transmission coil (which is received in the local coil) during the movement of the local coil 6 (together with the patient bed) in the direction d into the whole-body coil 2; at d=0 the local coil is thereby below the transmission coil in FIG. 1, thus—given arrangement of the transmission coil 7 at the entrance of the whole-body coil 2, for instance—at the entrance (or otherwise correspondingly displaced, as is also in FIG. 1 where the transmission coil is somewhat to the right of the entrance). In FIG. 6 the maximum of the amplitude occurs when the local coil is located below the transmission coil. Given a greater distance (20 cm) of the local coil from the transmission coil, given positioning below this the amplitude is somewhat lower than at a smaller distance (14 cm).

In addition to the amplitude of the signal which the local coil 6 receives from the transmission coil 7, the phase of this signal can also be evaluated.

Figure 7:
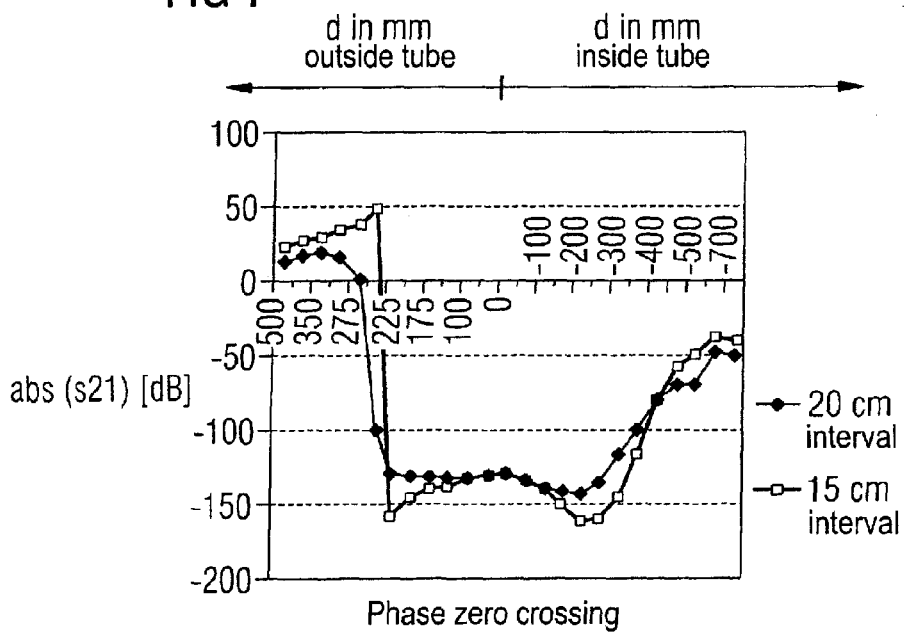
FIG. 7 shows phase curves in the local coil.

FIG. 7 shows an example of the measured curve of the phase of the signal sent by the transmission coil and received in the local coil during the movement of the local coil 6 (together with the patient bed) in the direction d into the whole-body coil 2. In FIG. 7 a zero crossing of the phase shift between the transmission coil and the local coil at a specific position of the local coil is to be detected with the position determination device.

Existing coils, in particular pickup coils of the body coil that serve to detect body coil B1 fields in the transmission operation of the body coil can be used as transmitting coils (here also called coupling coils). The pickup coils have previously not been used during the insertion of the bed and could be connected with a signal source 10 instead of with a receiver device via crossover switches such as switch 12. In principle, given the presence of a multi-channel transmission array it would also be possible to use its elements in place of the pickup coils.

By the use of more than one transmission coil (at different positions and/or different orientations and/or with different phases of its transmission signal), the position of the local coil can be determined in multiple dimensions. If multiple transmission coils are used for coil detection, their signals can be differentiated in the local coil, for example via different transmission frequencies or via a multiplexing (temporally offset transmission of the individual coils).

Although modifications and changes may be suggested by those skilled in the art, it is the intention of the inventors to embody within the patent warranted hereon all changes and modifications as reasonably and properly come within the scope of their contribution to the art.

We claim as our invention:

1. A device to determine a position of a magnetic resonance local coil of a magnetic resonance data acquisition unit, comprising:
at least one transmission coil associated with a magnetic resonance data acquisition unit, said at least one transmission coil radiating an electromagnetic signal;
a magnetic resonance local coil that receives said electromagnetic signal radiated by said at least one transmission coil and that generates a local coil signal dependent thereon, said local coil signal exhibiting an amplitude and a phase; and a computerized position determination device in communication with said magnetic resonance local coil that receives said local coil signal therefrom, and that is configured to evaluate said local coil signal to determine a position of the magnetic resonance local coil relative to a selected location associated with said data acquisition unit, by plotting a signal curve of said local coil signal, selected from the group consisting of a signal curve of said phase and a signal curve of said amplitude, with respect to an axis and identifying said position of said local coil directly from an actual zero-crossing of said axis by the signal curve of said local coil signal.

2. A device as claimed in claim 1 comprising a plurality of transmission coils associated with said data acquisition unit that each radiate an electromagnetic signal, and wherein said magnetic resonance local coil detects each of the respective electromagnetic signals and generates respective coil signals dependent thereon, and wherein said position determination device is configured to determine the position of the magnetic resonance local coil from all of said coil signals.

3. A device as claimed in claim 2 comprising a control unit that operates said plurality of transmission coils to radiate said respective electromagnetic signals with different or temporally offset transmission times.

4. A device as claimed in claim 2 wherein said plurality of transmission coils form a multi-channel transmission array.

5. A device as claimed in claim 1 wherein said position determination device is configured to determine the position of the magnetic resonance local coil relative to said transmission coil or relative to said data acquisition unit.

6. A device as claimed in claim 1 wherein said data acquisition unit comprises a movable bed adapted to receive a patient thereon, and wherein said patient determination unit is configured to determine the position of the magnetic resonance local coil relative to the bed or relative to the patient.

7. A device as claimed in claim 6 wherein said bed is displaced through a plurality of bed positions, and wherein said position determination unit is configured to determine said position of said magnetic resonance local coil dependent on said bed position.

8. A device as claimed in claim 1 wherein said at least one transmission coil and said magnetic resonance local coil are oriented co-planar relative to each other.

9. A device as claimed in claim 1 wherein said at least one transmission coil and said magnetic resonance local coil are oriented orthogonally relative to each other.

10. A method to determine a position of a magnetic resonance local coil of a magnetic resonance data acquisition unit, comprising the steps of:

from at least one transmission coil associated with a magnetic resonance data acquisition unit, radiating an electromagnetic signal;

with a magnetic resonance local coil, receiving said electromagnetic signal radiated by said at least one transmission coil and generating a local coil signal dependent thereon, said local coil signal exhibiting an amplitude and a phase; and supplying a computerized position determination device in communication with said local coil signal and, in said position determination device, automatically evaluating said local coil signal to determine a position of the magnetic resonance local coil relative to a selected location associated with said data acquisition unit, by plotting a signal curve said local coil signal, selected from the group consisting of a signal curve of said phase and a signal curve of said amplitude, with respect to an axis and identifying said position of said local coil directly from an actual zero-crossing of said axis by the signal curve of said local coil signal.

11. A method as claimed in claim 10 comprising, from a plurality of transmission coils associated with said data acquisition unit, individually radiating respective electromagnetic signals and, with said magnetic resonance local coil, detecting each of the respective electromagnetic signals and generating respective coil signals dependent thereon, and in said position determination device, determining the position of the magnetic resonance local coil from all of said coil signals.

12. A method as claimed in claim 11 comprising, from said plurality of transmission coils, radiating said respective electromagnetic signals with different or temporally offset transmission times.

13. A method as claimed in claim 11 comprising employing a multi-channel transmission array as said plurality of transmission coils.

14. A method as claimed in claim 10 comprising, in said position determination device, determining the position of the magnetic resonance local coil relative to said transmission coil or relative to said data acquisition unit.

15. A method as claimed in claim 10 wherein said data acquisition unit comprises a movable bed adapted to receive a patient thereon and comprising, in said patient determination unit, determining the position of the magnetic resonance local coil relative to the bed or relative to the patient.

16. A method as claimed in claim 15 comprising displacing said bed through a plurality of bed positions and, in said position determination unit, determining said position of said magnetic resonance local coil dependent on said bed position.

17. A method as claimed in claim 10 comprising orienting said at least one transmission coil and said magnetic resonance local coil co-planar relative to each other.

18. A method as claimed in claim 10 comprising orienting said at least one transmission coil and said magnetic resonance local coil orthogonally relative to each other.

19. A device to determine a position of a magnetic resonance local coil of a magnetic resonance data acquisition unit, said magnetic resonance data acquisition unit comprising a body coil that radiates a B1 field in said magnetic resonance data acquisition unit, said device comprising:

at least one transmission coil associated with said magnetic resonance data acquisition unit, said at least one transmission coil radiating an electromagnetic signal;

said transmission coil also being configured to detect said B1 field of said body coil;

a magnetic resonance local coil that receives said electromagnetic signal radiated by said at least one transmission coil and that generates a local coil signal dependent thereon, said local coil signal exhibiting an amplitude and a phase; and a computerized position determination device in communication with said magnetic resonance local coil that receives said local coil signal therefrom, and that is configured to evaluate said local coil signal to determine a position of the magnetic resonance local coil relative to a selected location associated with said data acquisition unit, by plotting a signal curve of said local coil signal, selected from the group consisting of a signal curve of said phase and a signal curve of said amplitude, with respect to an axis and identifying said position of said local coil directly from an actual zero-crossing of said axis by the signal curve of said local coil signal.

20. A device as claimed in claim 19 comprising an automatically or manually operated switch connected to said at least one transmission coil allowing operation of said transmission coil to detect said characteristic of said B1 field or to radiate said electromagnetic signal, dependent on a state of said switch.

21. A method to determine a position of a magnetic resonance local coil of a magnetic resonance data acquisition unit, said magnetic resonance data acquisition unit comprising a body coil that radiates a B1 field in said magnetic resonance data acquisition unit, said method comprising:

operating at least one transmission coil associated with said magnetic resonance data acquisition unit to radiate an electromagnetic signal;

with said transmission coil, also detecting said B1 field of said body coil;

with a magnetic resonance local coil, receiving said electromagnetic signal radiated by said at least one transmission coil and generating a local coil signal dependent thereon, said local coil signal exhibiting an amplitude and a phase; and in a computerized position determination device in communication with said magnetic resonance local coil that receives said local coil signal therefrom, automatically evaluating said local coil signal to determine a position of the magnetic resonance local coil relative to a selected location associated with said data acquisition unit, by plotting a curve of said local coil signal, selected from the group consisting of a signal curve of said phase and a signal curve of said amplitude, with respect to an axis and identifying said position of said local coil directly from an actual zero-crossing of said axis by the signal curve of said local coil signal.

22. A method as claimed in claim 21 comprising switching operation of said transmission coil between detecting said characteristic of said B1 field or radiating said electromagnetic signal.

* * * * *